United States Patent [19]
Weber et al.

[11] Patent Number: 5,852,563
[45] Date of Patent: Dec. 22, 1998

[54] INTELLIGENT COOLANT FLOW CONTROL SYSTEM

[75] Inventors: Richard M. Weber, Prosper; James F. Kviatkofsky, Allen, both of Tex.

[73] Assignee: Raytheon TI Systems, Inc., Lewisville, Tex.

[21] Appl. No.: 815,028

[22] Filed: Mar. 14, 1997

Related U.S. Application Data

[60] Provisional application No. 60/015,111 Apr. 10, 1996.
[51] Int. Cl.⁶ ....................................................... G01F 1/00
[52] U.S. Cl. ....................................................... 364/528.17
[58] Field of Search .............................. 364/510, 528.17; 123/41, 41.02, 41.13; 361/385

[56] References Cited

U.S. PATENT DOCUMENTS

| | | | |
|---|---|---|---|
| 4,260,336 | 4/1981 | Johnson | 416/96 |
| 4,744,335 | 5/1988 | Miller | 123/41.1 |
| 5,057,968 | 10/1991 | Morrison | 361/385 |
| 5,249,742 | 10/1993 | Attebury et al. | 237/2 |
| 5,375,650 | 12/1994 | Mizuno | 165/40 |
| 5,404,842 | 4/1995 | Matsushiro et al. | 123/41.13 |

*Primary Examiner*—Emanuel Todd Voeltz
*Assistant Examiner*—Matthew Smithers
*Attorney, Agent, or Firm*—Baker & Botts L.L.P.

[57] ABSTRACT

A coolant distribution system and method for a plurality of devices requiring cooling where the coolant source is of limited capacity. The system and method apportion coolant to each of the devices requiring cooling based upon instantaneous knowledge of the waste heat load of the devices. This is accomplished by providing a scheduler, which is preferably a computer having a data base, to concurrently determine the instantaneous amount of coolant apportioned for each of the devices. In response to this determination the flow of coolant from the coolant source to the devices is controlled in accordance with the apportioned flow of coolant for each device based upon a predetermined schedule. The coolant flow rate is controlled by providing a controllable valve coupled to the coolant source, determining the flow rate of coolant through the valve and a flow controller responsive to the scheduler and the determination of the flow rate of coolant through said controllable valve to control the controllable valve.

14 Claims, 1 Drawing Sheet

INTELLIGENT COOLANT FLOW CONTROL SYSTEM

This application claims the benefit of U.S. Provisional application No. 60/015,111, filed on Apr. 10, 1996, abandoned.

BACKGROUND OF THE INVENTION

1. Field of the Invention

This invention relates to a coolant distribution system and method for a plurality of devices requiring cooling where the coolant source is of limited capacity.

2. Brief Description of the Prior Art

A significant problem arises in systems, such as, for example, phased array systems, wherein there is a requirement for removal of waste heat from multiple phased arrays that share a single source of coolant. This is complicated by the fact that systems using multiple arrays can have several different types of phased arrays used in unpredictable combinations. Also, similar arrays can be operated in different modes along with dissimilar arrays also in different modes among themselves. The problem is to control the available coolant to remove waste heat while providing conditions that promote maximum system coolant use efficiency and maximum system level reliability. This problem is increasingly apparent where the amount of available coolant is limited and may be insufficient to provide the required cooling if not efficiently used or which may be insufficient even if efficiently used and must be judiciously apportioned to maximize system reliability under these conditions.

Prior art cooling systems have generally operated selectively on an all on or all off basis, or have provided the coolant to all devices in the system on a continuous basis, regardless of cooling requirements and the amount of waste heat generated by each device as a function of time.

SUMMARY OF THE INVENTION

In accordance with the present invention, there is provided a system for making maximum utilization of a coolant flow when multiple phased arrays are cooled from a common coolant source.

The invention allows for the optimization of coolant flow rate to those arrays producing more waste heat while comprehending the flow requirements for the arrays producing lesser waste heat. Doing so for all allowable combinations of array simultaneous operation insures each array is operating with the lowest possible failure rate levels. With an increased coolant flow rate, there is increased efficiency of waste heat removal from array subassemblies. This results in decreased component temperatures. With decreased component temperatures, lower component failure rates result. By intelligently controlling the flow of coolant reactive to array usage, active systems are operated in a mode where the component temperatures are at the lowest possible for the overall level of system usage and system performance at that time. The intelligent controller adjusts the coolant flow rate reactive to any state of array usage. With this form of control, the system runs with the lowest possible component failure rates possible based upon the overall level of system usage.

Briefly, there is provided a coolant distribution system and method for a plurality of devices requiring cooling where the coolant source is of limited capacity. The system and method apportion coolant to each of the devices requiring cooling based upon instantaneous coolant requirement. This is accomplished by providing a scheduler, which is preferably a computer having a data base, to concurrently determine the instantaneous amount of coolant that can be apportioned to each of the devices. In response to this determination the flow of coolant from the coolant source to the devices is controlled in accordance with the total cooling available and the apportioned amount for each device. The coolant flow rate is controlled by providing a controllable valve coupled to the coolant source, determining the flow rate of coolant through the valve and a flow controller responsive to the scheduler and the determination of the flow rate of coolant through said controllable valve to control the controllable valve.

DESCRIPTION OF THE PREFERRED EMBODIMENT

Figure 1:
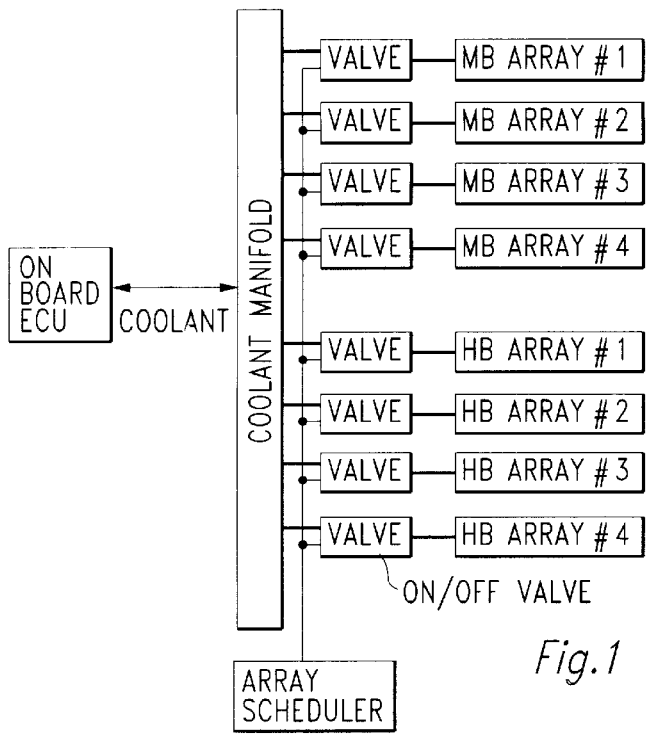
FIG. 1 is a block diagram of a coolant distribution system in general and typical of the prior art wherein the valves are either "on" or "off", thus not controlling the fluid reactive to a rationale.

Referring to FIG. 1, there is shown the architecture in accordance with the present invention when used in a jammer pod that has eight phased arrays. In the example shown, four of the phased arrays are high band arrays and four arrays are midband arrays, it being understood that the array being cooled are merely exemplary and can be replaced by other types of arrays or any other type of device requiring cooling on a continual or intermittent basis. The eight arrays are required to be operational simultaneously within prime power limits and in combinations below prime power limits. Whereas the prior art systems generally apply a constant flow of coolant of constant amount to all of the arrays, regardless of heat requirements at any point in time, the intelligent coolant flow control system partitions coolant flow for each array based upon requirement at that time on a "pound mass per minute per KW" basis for all allowable combinations of simultaneous operation, both at and below prime power limits. During periods of operation, when all arrays are not fully active or not active at all, increased coolant flow is provided to those arrays that are fully or partially active, this being accomplished by partitioning the flow of coolant to the array in proportion to the amount of waste heat each active array produces at that time. Simultaneously, coolant flow rate can be decreased or even stopped to those array which are then inactive.

Figure 2:
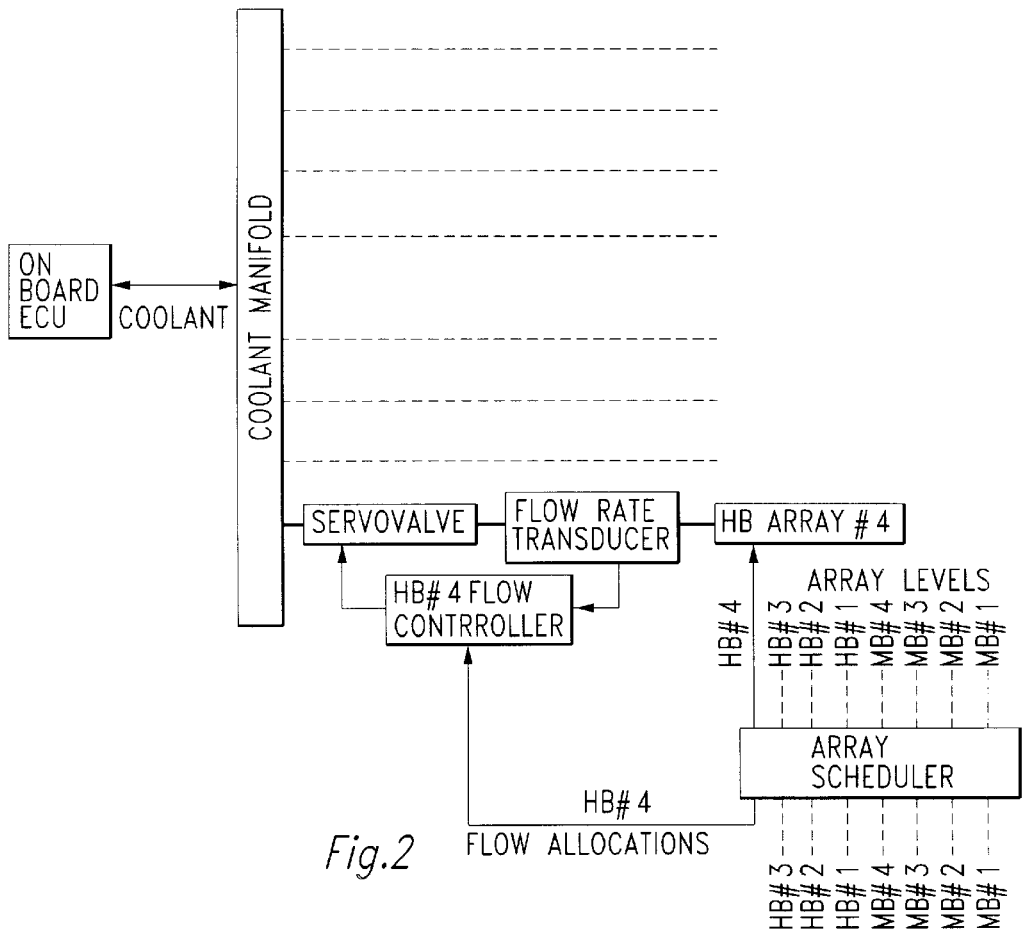
FIG. 2 is a block diagram of an intelligent coolant flow control system in accordance with the present invention as used in the coolant distribution system of FIG. 1.

FIG. 1 describes a coolant distribution generally which depicts both the prior art as well as the present invention when the structure of FIG. 2 is added thereto as explained hereinbelow. In the prior art, coolant is cooled by the on board Environmental Control Unit (ECU) and pumped to the coolant manifold. The coolant is then directed continually at a predetermined level to each of the arrays shown as high band (HB) Array #1 to HB Array #4 and medium band (MB) Array #1 to MB Array #4 to cool these arrays with the heated coolant then being returned to the coolant manifold and then back to the on board ECU for cooling and recycling. The only control is for the flows to either be "on" or "off" using valves. The problem with the prior art system as described is that a constant flow of coolant of constant volume is sent to each array from the coolant distribution system without regard to the amount of heat produced at that time by each array, this often leaving an insufficient amount of coolant for other arrays that have higher levels of waste heat.

As shown in FIG. 2, this problem is remedied by providing an intelligent coolant flow control at the coolant distribution system, one such FIG. 2 system being provided for each of the eight arrays shown in FIG. 1. The on board ECU system is the same as in FIG. 1 and performs the same function of cooling received heated coolant and returning the coolant to the system. The fluid manifold is common to all of the arrays and makes the coolant available to the servovalves for each of the eight arrays shown. However, the amount of coolant permitted to pass through the servovalve is controlled by a flow controller which, in turn, is responsive to a flow rate transducer which measures the coolant flow rate to the particular one of the eight arrays being cooled by the intelligent flow control system and an array scheduler which determines the amount of coolant required by that array and provides a flow demand signal to the flow controller for that array in view thereof. The heated coolant is returned to the fluid manifold from the array and then from the manifold to the on board ECU for cooling and return to the system. The servovalve can be any standard valve wherein the fluid flow therethrough can be controlled and the flow controller is any standard device which can control the servovalve in response to some command thereto.

The array scheduler is a computer based system that controls the arrays to achieve the required tactical functionality. It also apportions the available coolant flow to each individual array in proportion to the amount of waste heat produced by the individual array relative to the total waste heat produced by all active arrays. In most pod mounted jammer applications, it is expected that the arrays will be operating at different duty cycles and thus will produce different levels of waste heat. Accordingly, the array scheduler determines the apportioned flow to each array and provides a signal to each individual flow controller channel to open the servovalve sufficient to provide the proportioned amount of coolant flow. In cases where the total waste heat produced is less than the ECU capacity, the coolant is still apportioned by the same proportion with the resultant being increased flow made available to each active array. This results in cooler operation and enhance reliability. Normal operation would limit array total waste heat to the heat removal capacity of the ECU. In this mode, maximum array utilization is realized with flow directed to the individual arrays based upon array usage at that exact instant of time. As individual array usage changes with time, so does the apportioned flow to each individual array.

In the case where, due to a tactical necessity, the arrays are required to run for a limited time where the total array waste heat exceeds the ECU heat removal capacity, coolant fluid is still apportioned in the same manner. This insures that, under short term overload conditions, the available cooling capacity, although inadequate, is distributed in such a way that thermal damage and reliability degradation are minimized.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A coolant distribution system for a plurality of devices requiring cooling which comprises:

(a) a coolant source of limited capacity; and
(b) a system for apportioning coolant to each of said devices requiring cooling based upon instantaneous knowledge of the waste heat load of each of said devices, said system comprising:
  (i) scheduler means to concurrently determine the instantaneous amount of coolant required at each of said devices; and
  (ii) means responsive to said scheduler means to control the flow of coolant from said coolant source to said devices in accordance with the coolant apportioned for each of said devices.

2. The system of claim 1 wherein said coolant source has insufficient capacity to adequately cool each of said devices concurrently and wherein said scheduler further determines the total system heat load and apportions said available coolant in accordance with a predetermined schedule.

3. The system of claim 2 wherein said means responsive to said scheduler includes a controllable valve coupled to said coolant source, means to determine the flow rate of coolant through said valve and a flow controller responsive to said scheduler means and said means to determine the flow rate of coolant through said controllable valve to control said controllable valve.

4. The system of claim 2 wherein said scheduler is a computer having a data base.

5. The system of claim 1 wherein said means responsive to said scheduler includes a controllable valve coupled to said coolant source, means to determine the flow rate of coolant through said valve and a flow controller responsive to said scheduler means and said means to determine the flow rate of coolant through said controllable valve to control said controllable valve.

6. The system of claim 1 wherein said scheduler is a computer having a data base.

7. The system of claim 1, wherein each of said devices is a phased array.

8. The system of claim 1, wherein said scheduler means includes means for independently controlling operation of each of said devices, the waste heat load of each said device varying in dependence on the operation thereof.

9. A method of distributing coolant to a plurality of devices requiring cooling which comprises the steps of:

(a) providing a coolant source of limited capacity; and
(b) apportioning coolant to each of said devices requiring cooling based upon instantaneous knowledge of the waste heat load of each of said devices, said method further comprising the steps of:
  (i) concurrently determining the instantaneous amount of coolant apportioned for each of said devices; and
  (ii) controlling the flow of coolant from said coolant source to said devices in accordance with the cooling requirement of each device.

10. The method of claim 9 wherein said coolant source has insufficient capacity to adequately cool each of said devices concurrently and wherein said scheduler further determines the total system heat load and apportions said available coolant in accordance with a predetermined schedule.

11. The method of claim 10 wherein said step of controlling the flow of coolant to a said device comprises the steps of controlling a valve between the source of coolant and said device responsive to the instantaneous cooling requirement of said device and the flow rate of coolant through said valve.

12. The method of claim 9 wherein said step of controlling the flow of coolant to a said device comprises the steps of controlling a valve between the source of coolant and said device responsive to the instantaneous cooling requirement of said device and the flow rate of coolant through said valve.

13. The method of claim 9, wherein each of said devices is a phased array.

14. The method of claim 9, including the step of independently controlling operation of each of said devices, the waste heat load of each said device varying in dependence on the operation thereof.

* * * * *